(12) United States Patent
Yang et al.

(10) Patent No.: US 10,049,706 B2
(45) Date of Patent: Aug. 14, 2018

(54) MEMORY AND METHOD OF OPERATING THE SAME

(71) Applicant: TAIWAN SEMICONDUCTOR MANUFACTURING COMPANY, LTD., Hsinchu (TW)

(72) Inventors: Jung-Ping Yang, Jui-bei (TW); Hong-Chen Cheng, Hsinchu (TW); Chih-Chieh Chiu, Toufen Township (TW); Chia-En Huang, Xinfeng Township (TW); Cheng Hung Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/870,402

(22) Filed: Sep. 30, 2015

(65) Prior Publication Data

US 2016/0019939 A1     Jan. 21, 2016

Related U.S. Application Data

(63) Continuation of application No. 13/362,847, filed on Jan. 31, 2012, now Pat. No. 9,153,302.

(51) Int. Cl.
| | |
|---|---|
| *G11C 7/00* | (2006.01) |
| *G11C 7/12* | (2006.01) |
| *G11C 7/18* | (2006.01) |
| *G11C 11/419* | (2006.01) |
| *G11C 7/10* | (2006.01) |

(52) U.S. Cl.
CPC ........... *G11C 7/12* (2013.01); *G11C 7/106* (2013.01); *G11C 7/1087* (2013.01); *G11C 7/18* (2013.01); *G11C 11/419* (2013.01); *G11C 2207/005* (2013.01)

(58) Field of Classification Search
CPC .......... G11C 11/4091; G11C 11/4097; G11C 11/419; G11C 11/4094; G11C 2029/1204; G11C 2029/5004
See application file for complete search history.

(56) References Cited

U.S. PATENT DOCUMENTS

| | | | | |
|---|---|---|---|---|
| 5,625,592 A | * | 4/1997 | Shinozaki | G11C 7/1048 365/189.14 |
| 6,144,602 A | * | 11/2000 | Uzawa | G11C 7/1048 365/203 |

(Continued)

FOREIGN PATENT DOCUMENTS

| | | |
|---|---|---|
| CN | 1637947 | 7/2005 |
| CN | 1963948 | 5/2007 |

*Primary Examiner* — Uyen B Tran
(74) *Attorney, Agent, or Firm* — Hauptman Ham, LLP

(57) ABSTRACT

A memory includes a plurality of memory blocks, a plurality of sensing circuits, a plurality of global bit lines, a common pre-charging circuit and a selection circuit. Each global bit line of the plurality of global bit lines is coupled to at least one of the memory blocks by a corresponding sensing circuit of the plurality of sensing circuits. The common pre-charging circuit is configured to individually pre-charge each global bit line of the plurality of global bit lines to a pre-charge voltage. The selection circuit is configured to selectively couple the common pre-charging circuit to a selected global bit line of the plurality of global bit lines.

20 Claims, 6 Drawing Sheets

(56) References Cited

U.S. PATENT DOCUMENTS

| | | | | |
|---|---|---|---|---|
| 6,320,806 B1* | 11/2001 | Han | ............... | G11C 7/1048 |
| | | | | 365/189.05 |
| 6,442,089 B1* | 8/2002 | Fletcher | ............ | G11C 7/065 |
| | | | | 365/203 |
| 8,964,439 B2* | 2/2015 | Nagata | ............... | G11C 7/12 |
| | | | | 365/203 |
| 2006/0280022 A1* | 12/2006 | Kono | ............. | G11C 16/0433 |
| | | | | 365/230.03 |
| 2007/0104002 A1* | 5/2007 | Edahiro | ............ | G11C 7/06 |
| | | | | 365/203 |
| 2008/0198654 A1 | 8/2008 | Toda | | |
| 2008/0291762 A1* | 11/2008 | Kajigaya | ......... | G11C 11/4076 |
| | | | | 365/203 |
| 2010/0188912 A1* | 7/2010 | Shinohara | .......... | G11C 7/12 |
| | | | | 365/203 |
| 2010/0238749 A1* | 9/2010 | Kushida | .......... | G11C 11/419 |
| | | | | 365/203 |
| 2010/0315893 A1* | 12/2010 | Hong | ............. | G11C 7/1048 |
| | | | | 365/203 |
| 2011/0149663 A1 | 6/2011 | Yoshida | | |
| 2011/0182114 A1 | 7/2011 | Em et al. | | |
| 2012/0314484 A1* | 12/2012 | Koya | ............. | G11C 7/16 |
| | | | | 365/149 |

\* cited by examiner

MEMORY AND METHOD OF OPERATING THE SAME

PRIORITY CLAIM

The present application is a continuation of U.S. application Ser. No. 13/362,847, filed Jan. 31, 2012, now U.S. Pat. No. 9,153,302, issued Oct. 6, 2015, which is incorporated herein by reference in its entirety.

BACKGROUND

Besides processors, memories are main parts of computing systems and electronic devices. The performance of a memory, such as capacity, access speed, power consumption, etc. has an impact on the overall performance of the system or electronic device. Developments are constantly sought to improve memory performance.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIG. 1 is a schematic circuit diagram of a segment of a memory in accordance with some embodiments.

FIG. 2A is a schematic block diagram of a memory in accordance with some embodiments.

FIG. 2B is a schematic circuit diagram of a memory in accordance with some embodiments.

FIG. 3 includes timing diagrams of voltages during operation of a memory in accordance with some embodiments.

FIG. 4 is a schematic circuit diagram of a memory in accordance with some embodiments.

FIG. 5 is a flow chart of a method of operating a memory in accordance with some embodiments.

DETAILED DESCRIPTION

It is to be understood that the following disclosure provides many different embodiments or examples, for implementing different features of various embodiments. Specific examples of components and arrangements are described below to simplify the present disclosure. The inventive concept may, however, be embodied in many different forms and should not be construed as being limited to the embodiments set forth herein; rather, these embodiments are provided so that this description will be thorough and complete, and will fully convey the inventive concept to those of ordinary skill in the art. It will be apparent, however, that one or more embodiments may be practiced without these specific details.

The drawings are not drawn to scale, and include certain features that are exaggerated for clarity. Like reference numerals in the drawings denote like elements. The elements and regions illustrated in the figures are schematic in nature, and thus relative sizes or intervals illustrated in the figures are not intended to limit the scope of the inventive concept.

FIG. 1 is a schematic circuit diagram of a segment of a memory 100 in accordance with some embodiments. The memory 100 includes a plurality of memory cells 102, a plurality of pairs of bit lines BL/BLB, and a plurality of global bit lines GBL. Multiple memory cells 102 are coupled to the pairs of bit lines to form memory blocks. Specifically, multiple memory cells 102 are coupled to the pair of bit lines BL0U and BLB0U to form an upper half of a memory block 120, whereas multiple memory cells 102 are coupled to the pair of bit lines BL0L and BLB0L to form a lower half of the memory block 120. Similarly, multiple memory cells 102 are coupled to the pair of bit lines BL1U and BLB1U to form an upper half of a memory block 121, whereas multiple memory cells 102 are coupled to the pair of bit lines BL1L and BLB1L to form a lower half of the memory block 121 etc. One or more memory blocks is coupled to a global bit line. Specifically, the memory block 120 is coupled to the global bit line GBL0, whereas the memory block 121 is coupled to the global bit line GBL1, etc. The memory 100 further includes a plurality of word lines WL(0)-WL(2*k*−1) (where k is an integer) coupled to the memory cells 102. The memory 100 has a lower half and an upper half. In the lower half, the memory cells 102 are coupled to one half of the word lines, i.e., the word lines WL(0)-WL(k−1). In the upper half, the memory cells 102 are coupled to the other half of the word lines, i.e., the word lines WL(k)-WL(2*k*−1). In FIG. 1, WT0/WC0 and WT1/WC1 denote pairs of write data lines.

The memory blocks, e.g., 120, 121, are similarly configured. One of the memory blocks, i.e., 120, is described in detail herein. The memory block 120 includes local bit line pre-charging circuits 104L, 104U, and pull-up circuits 106L, 106U in the lower and upper halves of the memory 100, respectively. The memory block 120 further includes a write pass gate circuit 108, a sensing amplifier 110, and a pull-down circuit 112 all of which are common for both the lower and upper halves. The sensing amplifier 110 and the pull-down circuit 112, commonly referred to herein as a sensing circuit 114, are coupled between the memory block 120 and the corresponding global bit line GBL0. The sensing amplifier 110 is connected to the bit lines BL0U and BL0L to detect a state of the bit lines BL0U and BL0L in a single-ended sensing scheme (i.e., one bit line BL0U, rather than both bit lines BL0U/BLB0U, is used for the sensing operation). In this example, the sensing amplifier 110 is implemented as a NAND gate, although other configurations are also within the scope of this disclosure. The local bit line pre-charging circuits 104L, 104U are similarly configured and each includes two p-channel metal-oxide semiconductor (PMOS) transistors. The pull-up circuits 106L, 106U are similarly configured and each includes two cross-coupled PMOS transistors. The memory block 120 in particular and the memory 100 in general have a symmetrical structure. In some embodiments, the memory 100 does not necessarily have a symmetrical structure. For example, the upper half of the memory 100, including the word lines WL(k)-WL(2*k*−1), the associated memory cells 102, the local bit line pre-charging circuits 104U and the pull-up circuits 106U, is omitted.

For read and/or write operations, the local bit line pre-charging circuits 104L, 104U are arranged to pre-charge the corresponding bit lines BL0U, BL0L, and the pull-up circuits 106L, 106U are arranged to pull up the pre-charged bit lines to a power supply voltage VDD. The write pass gate circuit 108 is arranged to enable or disable writing to the memory cells 102 in the memory block 120. When a logical "0" is read from a memory cell 102 in the memory block 120, the corresponding bit line (e.g., BL0U) is pulled down to a ground voltage, the sensing amplifier 110 outputs a high voltage to the pull-down circuit 112 which, in turn, is opened to pull the global bit line GBL0 to the ground voltage. When a logical "1" is read from a memory cell 102 in the memory block 120, the corresponding bit line (e.g., BL0U) is pulled up to the power supply voltage, the sensing amplifier 110 outputs a low voltage to the pull-down circuit 112 which, in turn, is closed and leave the global bit line GBL0 at a pre-charge voltage. Circuitry for pre-charging global bit lines in accordance with some embodiments are described below with respect to FIGS. 2A-5.

In some embodiments, several global bit lines share a common pre-charging circuit, thereby reducing the number of components and/or power consumption in the memory. In some embodiments, the global bit line is pre-charged to a pre-charge voltage lower than a power supply voltage applied to the pre-charging circuit, thereby reducing power consumption and current leakage.

Figure 1:
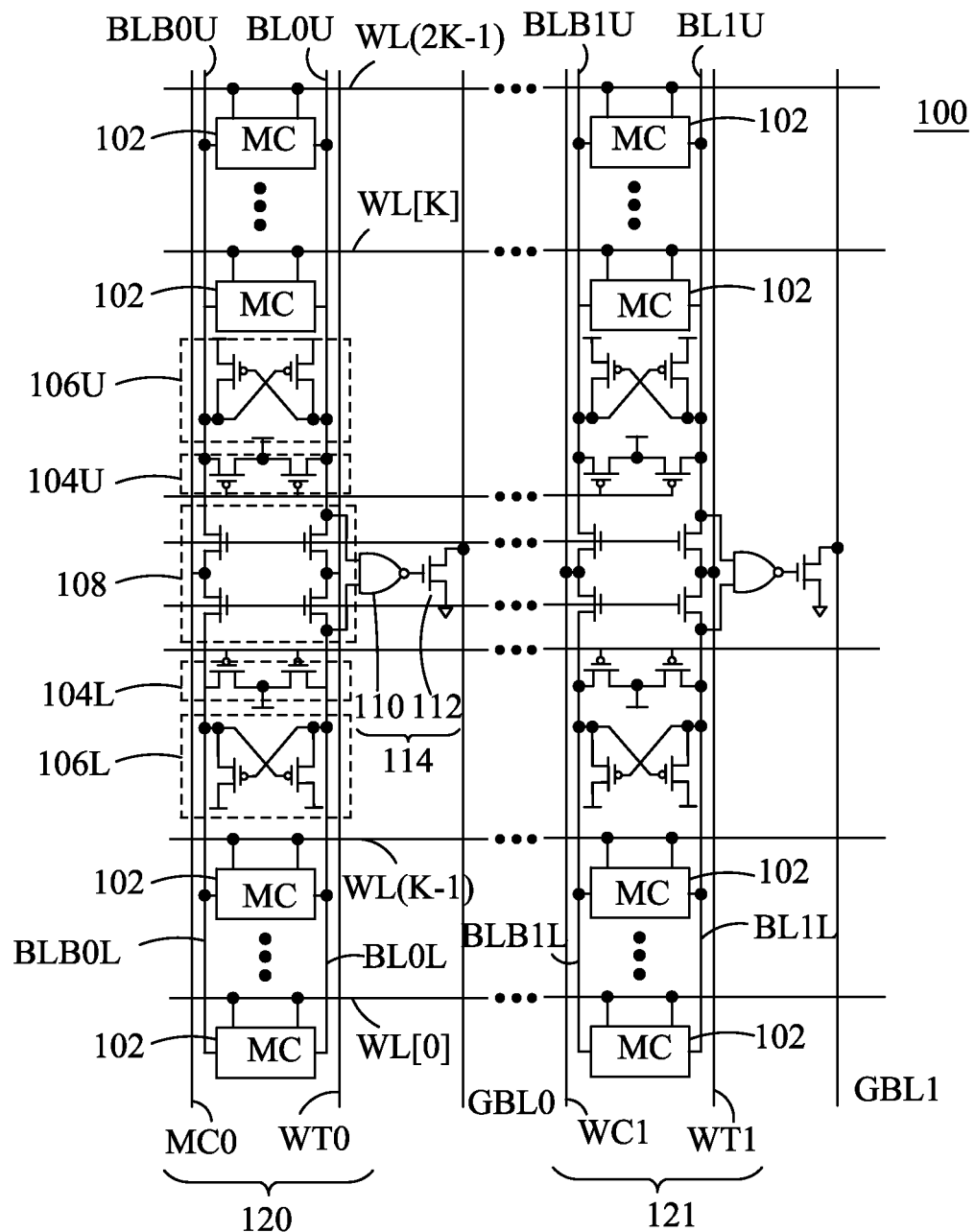
Figure 2A:
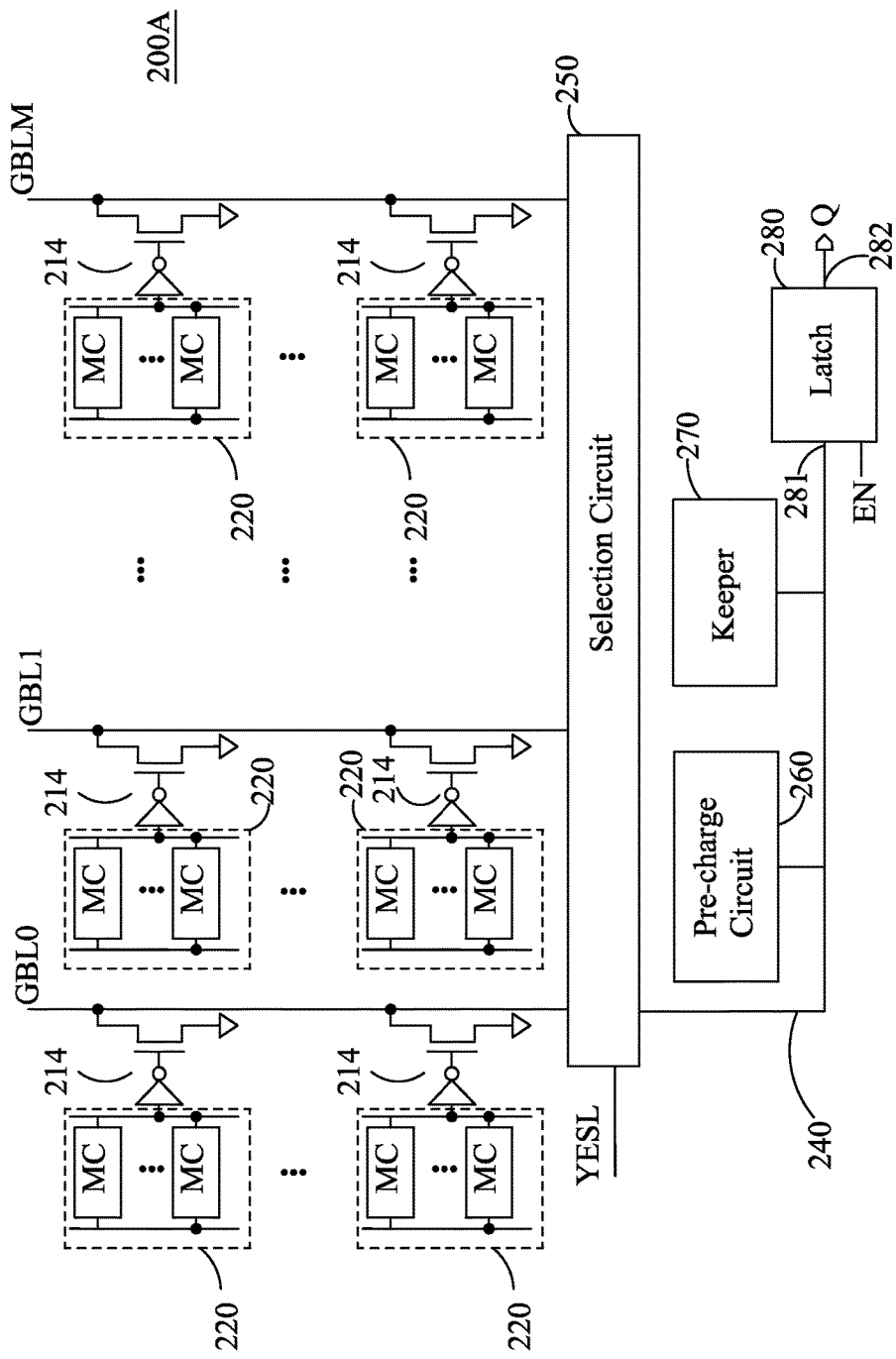

FIG. 2A is a schematic block diagram of a memory 200A in accordance with some embodiments. The memory 200A includes a plurality of memory blocks 220, and a plurality of global bit lines GBLi (where i=0, 1 . . . m). Each memory block 220 includes a pair of bit lines and a plurality of memory cells coupled to the pair of bit lines. In some embodiments, each memory block 220 is similar to the memory block 120 described with respect to FIG. 1. Each global bit line GBLi is coupled to at least one memory block 220. In the example illustrated in FIG. 2A, each global bit line GBLi is coupled to multiple memory blocks 220. Each memory block 220 is coupled to the corresponding global bit line GBLi by a sensing circuit 214. In some embodiments, the sensing circuit 214 is similar to the sensing circuit 114 described with respect to FIG. 1, although other configurations for the sensing circuit 214 are within the scope of the present disclosure.

The memory 200A further includes a selection circuit 250, a global bit line pre-charging circuit (also referred to herein as "pre-charging circuit") 260, a keeper circuit 270, and a latching circuit 280. The pre-charging circuit 260, keeper circuit 270 and latching circuit 280 are common to multiple global bit line, e.g., the global bit lines GBL0-GBLm, and are coupled to an output line 240 which, in turn, is coupled to one side of the selection circuit 250. The global bit lines GBL0-GBLm are coupled to the other side of the selection circuit 250.

The selection circuit 250 is coupled to receive a selection signal YSEL. Based on the selection signal YSEL, the selection circuit 250 couples one of the global bit lines GBL0-GBLm at a time to the output line 240, that is, to the pre-charging circuit 260, keeper circuit 270 and latching circuit 280. In some embodiments, the selection circuit 250 is a switching device. Any suitable configuration for a switching device, such as a multiplexer or a series of switches each coupled between the output line 240 and a corresponding one of the global bit lines GBL0-GBLm, is usable in some embodiments.

The pre-charging circuit 260 is arranged to pre-charge one of the global bit lines GBL0-GBLm at a time to a pre-charge voltage. For example, in a first time period when the global bit line GBL0 is selected in accordance with the selection signal YSEL, the selection circuit 250 couples the global bit line GBL0 to the pre-charging circuit 260 via the output line 240. The pre-charging circuit 260 pre-charges the global bit line GBL0 to a pre-charge voltage. Any suitable configuration for a pre-charging circuit is usable in some embodiments.

The keeper circuit 270, which is coupled to the pre-charging circuit 260 via the output line 240, is configured to maintain the pre-charge voltage on the global bit line GBL0 currently coupled by the selection circuit to the pre-charging circuit. The keeper circuit 270 compensates for the loss of charge on the global bit line GBL0 due to current leakage and/or capacitive coupling to nearby signal paths. Any suitable configuration for a keeper circuit is usable in some embodiments.

The global bit line GBL0 currently selected by the selection circuit 250 is charged to the pre-charge voltage by the pre-charging circuit 260, and is maintained at the pre-charge voltage by the keeper circuit 270. As described with respect to FIG. 1, the global bit line GBL0 is then pulled-down from the pre-charge voltage to the ground voltage or pulled-up to the power supply voltage, depending on whether a logical "0" or a logical "1" is read from a memory cell in one of the memory blocks 220 coupled to the global bit line GBL0.

The latching circuit 280 has an input 281 and an output 282. The input 281 is coupled to the currently selected global bit line GBL0 via the output line 240 and the selection circuit 250. The data read from a memory cell in one of the memory blocks 220 coupled to the global bit line GBL0 is placed on the global bit line GBL0 and supplied to the input 281. The latching circuit 280 is configured to latch the data received at the input 281 and to output the latched data at the output 282 in response to an enabling signal at an EN terminal of the latching circuit 280. The outputted data, denoted as Q in FIG. 2A, is further transmitted to external circuitry. Any suitable configuration for a latching circuit is usable in some embodiments.

In a second, subsequent time period, the global bit line GBL0 is de-selected and another global bit line, e.g., GBL1, is selected in accordance with the selection signal YSEL. The selection circuit 250 couples the global bit line GBL1 to the pre-charging circuit 260, the keeper circuit 270 and the latching circuit 280 via the output line 240, and the above-described operation repeats for the newly selected global bit line GBL1, as well as for subsequently selected global bit lines.

The global bit lines GBL0-GBLm are sequentially coupled, via the selection circuit 250, to a common output stage including the pre-charging circuit 260, keeper circuit 270 and latching circuit 280. The number m of global bit lines commonly sharing a common output stage is not limited to a particular number. In some embodiments, m is 2, or 4, or 8 or 16. Thus, it is not necessary to provide for each global bit line a separate pre-charging circuit and/or keeper circuit and/or latching circuit. As a result, the number of components as well as power consumption of the memory 200A are reduced. In some embodiments, when one of the global bit line is selected (i.e., coupled via the selection circuit 250 to the pre-charging circuit 260), the other global bit lines are left floating which further reduces active power and leakage.

Figure 2B:
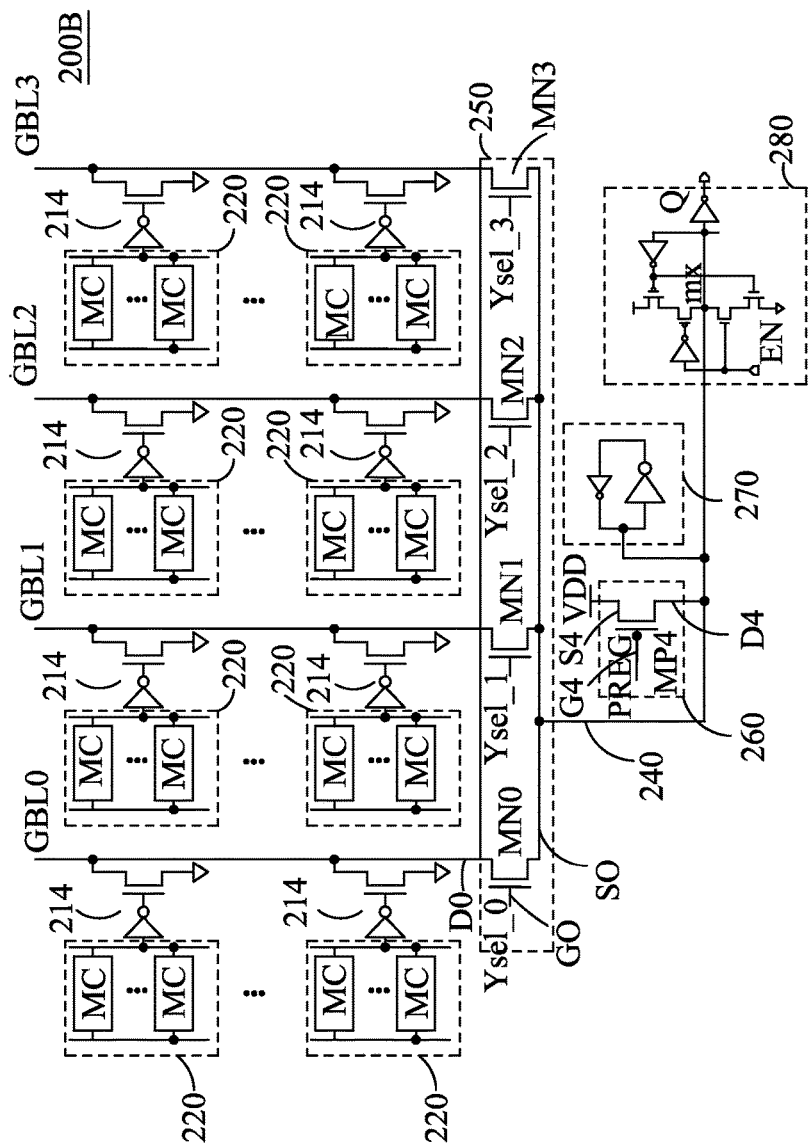

FIG. 2B is a schematic circuit diagram of a memory 200B in accordance with some embodiments. The memory 200B is a particular implementation of the memory 200A. Specifically, the selection circuit 250 is realized in the memory 200B by a plurality of n-channel metal-oxide semiconductor (NMOS) transistors MN0-MN3 each of which is coupled between one of the global bit lines GBL0-GBL3 and the output line 240. The pre-charging circuit 260 is realized in the memory 200B by a PMOS transistor MP4. Exemplary configurations for the keeper circuit 270 and the latching circuit 280 are also illustrated in FIG. 2B. The number m of global bit lines commonly sharing a common output stage in the memory 200B is 4.

Each of the NMOS transistors includes a drain coupled to the corresponding global bit line, a source coupled to the output line 240, and a gate coupled to receive a corresponding selection signal YSEL_0, YSEL_1, YSEL_2 or YSEL_3. For example, the NMOS transistor MN0 includes a drain D0 coupled to the corresponding global bit line GBL0, a source S0 coupled to the output line 240, and a gate G0 coupled to receive a corresponding selection signal YSEL_0 for selecting the global bit line GBL0. The PMOS transistor MP4 includes a source S4 coupled to the power supply voltage VDD, and a gate G4 coupled to receive a pre-charge signal PREG, and a drain D4 coupled to the sources of all of the NMOS transistors MN0-MN3 via the output line 240.

In operation, one of the global bit lines is selected at a time by the corresponding selection signal supplied to the gate of the corresponding NMOS transistor in the selection circuit 250. For example, the global bit line GBL0 is selected by the selection signal YSEL_0 supplied to the gate G0 of the NMOS transistor MN0. The global bit line GBL0 is connected via the NMOS transistor MN0 in the ON state to the drain D4 of the PMOS transistor MP4 via the output line 240. Upon application of the pre-charge signal PREG to the gate G4, the power supply voltage VDD at the source S4 of the PMOS transistor MP4 is supplied to the output line 240, thereby pre-charging the global bit line GBL0 to a pre-charge voltage Vpc which is lower than the power supply voltage VDD applied to the pre-charging circuit 260.

Specifically, the pre-charge voltage Vpc on the global bit line GBL0 is limited to (VDD−Vth), where Vth is the threshold voltage of the NMOS transistor MN0. In other words, the pre-charge voltage Vpc is a difference between the power supply voltage VDD and the threshold voltage of the NMOS transistor MN0. By pre-charging the global bit line GBL0 to a voltage between the power supply voltage VDD and the ground voltage VSS, the global bit line voltage swing is reduced which further lowers power consumption and a likelihood of leakage current. The reading operation is also accelerated.

Figure 3:
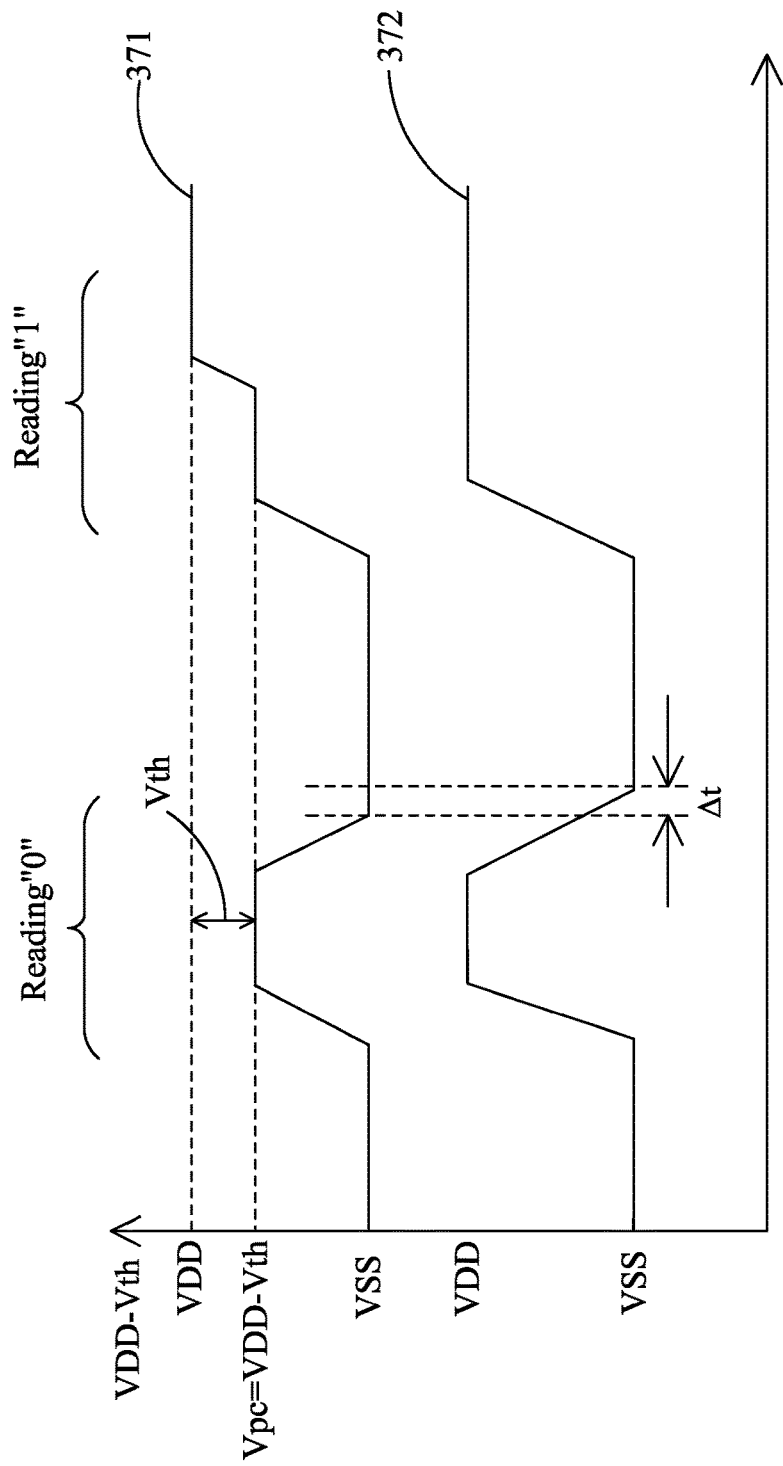

FIG. 3 includes timing diagrams of the global bit line voltage on the global bit line GBL0 during operation of the memory 200B in accordance with some embodiments. The line 371 in FIG. 3 indicates the global bit line voltage during the reading "0" and reading "1" operations when the global bit line GBL0 is pre-charged to Vpc=VDD−Vth. The line 371 in FIG. 3 indicates the global bit line voltage during the reading "0" and reading "1" operations when the global bit line GBL0 is pre-charged to VDD (full-swing pre-charging scheme).

Since the global bit line GBL0 (line 371) is pre-charged to (VDD−Vth) instead of VDD, and then pulled down to the ground voltage VSS for the reading "0" operation, it takes less time than a full-swing pull-down from the power supply voltage VDD (line 372) to the ground voltage VSS. The reading "0" operation is sped up by Δt. Further, compared with the full-swing pre-charging scheme (line 372), the lower pre-charge voltage (line 371) permits the memory to consume less power. Thus, the read/access time, the standby power, and active power of the memory 200B are reduced. In some embodiments, the memory 200B achieves about 15% reduction on reading operation power consumption, and/or about 20% reduction in leakage current over the full-swing pre-charging scheme.

In the reading "1" operation, the global bit line voltage is pulled up (line 371) to the power supply voltage VDD. In some embodiments, there is no significant delay in access time compared with the full-swing pre-charging scheme (line 372). Thus, by pre-charging the global bit line to a pre-charge voltage lower than the power supply voltage, various advantages are obtainable during one operation without sacrificing performance in another operation.

Figure 4:
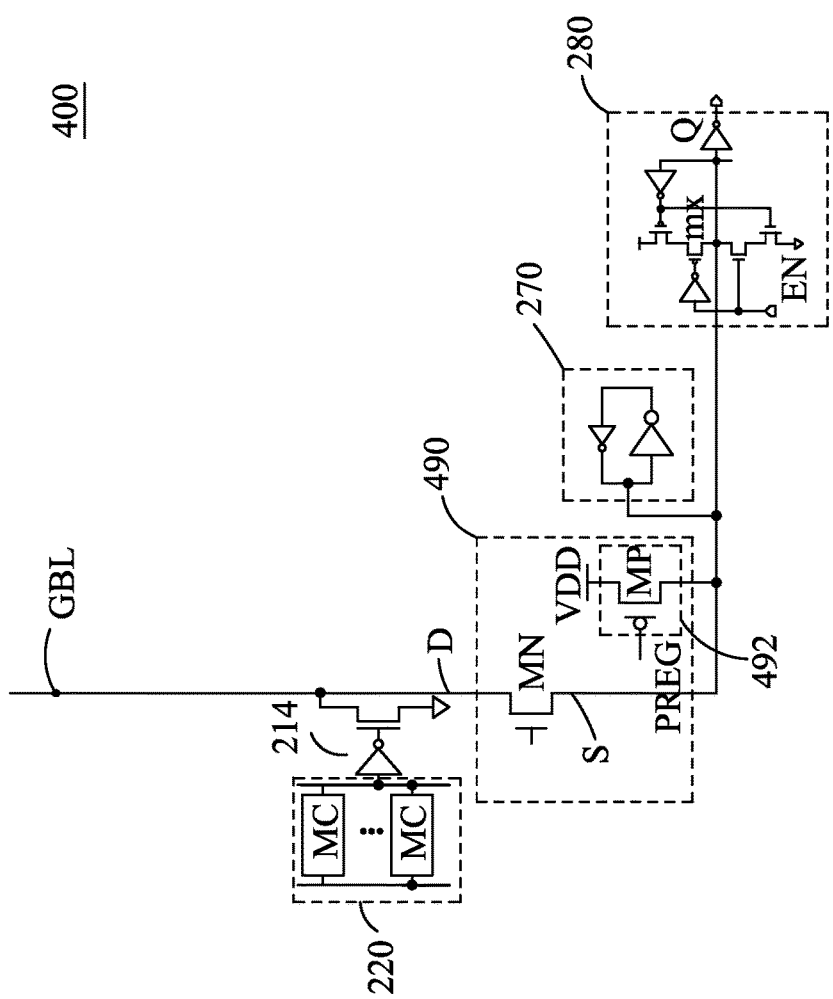

FIG. 4 is a schematic circuit diagram of a memory 400 in accordance with some embodiments. The memory 400 includes at least one memory block 220, and at least one global bit lines GBL. The memory block 220 includes a pair of bit lines and a plurality of memory cells coupled to the pair of bit lines. In some embodiments, the memory block 220 is similar to the memory block 120 described with respect to FIG. 1. The global bit line GBL is coupled to the at least one memory block 220, e.g., by a sensing circuit 214. In some embodiments, the sensing circuit 214 is similar to the sensing circuit 114 described with respect to FIG. 1, although other configurations for the sensing circuit 214 are within the scope of the present disclosure.

The memory 400 further includes a pre-charging device 490 which is configured to pre-charge the global bit line GBL to a pre-charge voltage lower than a power supply voltage VDD applied to the pre-charging device 490. In some embodiments, the pre-charging device 490 includes an NMOS transistor MN having a drain D coupled to the global bit line GBL. When the NMOS transistor MN is in the ON state and the power supply voltage VDD is supplied to the source S of the NMOS transistor MN, the pre-charge voltage on the global bit line GBL is the difference between the power supply voltage VDD and the threshold voltage of the NMOS transistor MN.

In some embodiments, the pre-charging device 490 further includes a switch 492 coupled between the NMOS transistor MN and the power supply voltage VDD. The switch 492 is configured to apply the power supply voltage VDD to the global bit line GBL via the NMOS transistor MN in response to a pre-charge signal PREG applied to the switch 492. Any switching circuit is usable in some embodiments as the switch 492. In one or more embodiments, the switch 492 includes a single PMOS transistors MP. The simplicity of the switch 492 and/or the pre-charging device 490 permits the memory 400 to reduce power consumption and/or to increase operating speed. Although an NMOS transistor is usable in the switch 492 in accordance with one or more embodiments, the inclusion of two NMOS transistors (including the NMOS transistor MN) between the power supply voltage VDD and the global bit line GBL introduces threshold voltage variability of two NMOS transistors which, under certain circumstances, might cause read margin degradation and/or charge sharing which prompt further design considerations.

Figure 5:
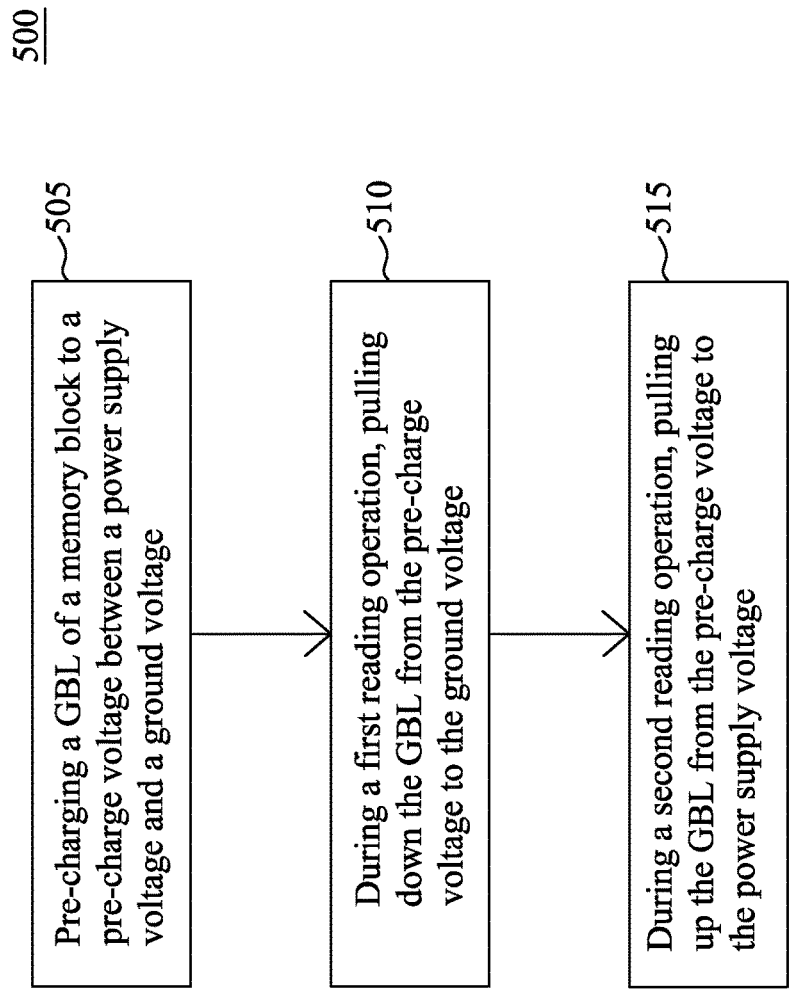

FIG. 5 is a flow chart of a method 500 of operating a memory in accordance with some embodiments. At step 505, a global bit line, which is coupled to at least one memory block including multiple memory cells of the memory, is pre-charged to a pre-charge voltage between a power supply voltage and a ground voltage. For example, in the memory 400 or 200B, the global bit line GBL or GBL0, which is coupled to at least one memory block 220 including multiple memory cells 102, is pre-charged to a pre-charge voltage Vpc between the power supply voltage VDD and the ground voltage VSS.

At step 510, during a first reading operation, the global bit line is pulled down from the pre-charge voltage to the ground voltage. For example, in the memory 400 or 200B, the global bit line GBL or GBL0, is pulled down from the pre-charge voltage Vpc to the ground voltage VSS during the reading "0" operation as described with respect to FIG. 4.

At step 515, during a second reading operation, the global bit line is pulled up from the pre-charge voltage to the power supply voltage. For example, in the memory 400 or 200B, the global bit line GBL or GBL0, is pulled up from the pre-charge voltage Vpc to the power supply voltage VDD during the reading "1" operation as described with respect to FIG. 4.

The above method embodiment shows exemplary steps, but they are not necessarily required to be performed in the order shown. Steps may be added, replaced, changed order, and/or eliminated as appropriate, in accordance with the spirit and scope of embodiments of the disclosure. Embodiments that combine different features and/or different embodiments are within scope of the disclosure and will be apparent to those skilled in the art after reviewing this disclosure.

The principles and/or effects disclosed herein are also applicable to a dual-rail sensing scheme which, in some embodiments, is realized without adding additional devices or components to the disclosed circuitry.

According to some embodiments, a memory comprises a plurality of memory blocks, a plurality of sensing circuits, a plurality of global bit lines, a common pre-charging circuit and a selection circuit. Each global bit line of the plurality of global bit lines is coupled to at least one of the memory blocks by a corresponding sensing circuit of the plurality of sensing circuits. The common pre-charging circuit is configured to individually pre-charge each global bit line of the plurality of global bit lines to a pre-charge voltage. The selection circuit is configured to selectively couple the common pre-charging circuit to a selected global bit line of the plurality of global bit lines.

According to some embodiments, a memory comprises at least one memory block, a global bit line, a sensing circuit and a global pre-charging device. The sensing circuit is coupled between the at least one memory block and the global bit line. The global pre-charging device configured to pre-charge the global bit line to a pre-charge voltage lower than a power supply voltage applied to the global pre-charging device.

According to some embodiments, a method of operating a memory comprises pre-charging, by a global pre-charging circuit, a global bit line coupled to at least one memory block including multiple memory cells of the memory, to a pre-charge voltage between a power supply voltage and a ground voltage; maintaining the pre-charge voltage on the global bit line; and during a reading operation, pulling down the global bit line from the pre-charge voltage to the ground voltage, or pulling up the global bit line from the pre-charge voltage to the power supply voltage based on data stored in a memory cell of the multiple memory cells.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A memory, comprising:
   a plurality of memory blocks, each memory block of the plurality of memory blocks comprising:
      a local bit line pre-charging circuit configured to pre-charge a pair of bit lines;
   a plurality of sensing circuits;
   a plurality of global bit lines, each global bit line of the plurality of global bit lines being coupled to at least one of the memory blocks of the plurality of memory blocks by a corresponding sensing circuit of the plurality of sensing circuits, wherein each corresponding sensing circuit of the plurality of sensing circuits is coupled between a global bit line of the plurality of global bit lines and a memory block of the plurality of memory blocks;
   a common pre-charging circuit configured to individually pre-charge each global bit line of the plurality of global bit lines to a pre-charge voltage;
   a common keeper circuit coupled to the common pre-charging circuit and the common keeper circuit comprising: a pair of cross-coupled inverters; and
   a selection circuit configured to selectively couple the common pre-charging circuit to a selected global bit line of the plurality of global bit lines.

2. The memory of claim 1, wherein at least one sensing circuit of the plurality of sensing circuits comprises:
   a sense amplifier coupled to the memory block of the plurality of memory blocks; and
   a pull-down circuit coupled between one of the plurality of global bit lines and the sense amplifier.

3. The memory of claim 2, wherein the pull-down circuit comprises an n-channel metal-oxide semiconductor (NMOS) transistor having:
   a gate terminal connected to an output terminal of the sense amplifier; and
   a drain terminal connected to the one of the plurality of global bit lines.

4. The memory of claim 1, wherein the pre-charge voltage is configured to be lower than a power supply voltage provided to the common pre-charging circuit.

5. The memory of claim 1, wherein the common keeper circuit is configured to maintain the pre-charge voltage on the selected global bit line of the plurality of global bit lines coupled by the selection circuit to the common pre-charging circuit.

6. The memory of claim 5, wherein the common keeper circuit is electrically connected to the selection circuit.

7. The memory of claim 1, further comprising a common output line coupled between the selection circuit and the common pre-charging circuit, wherein the selection circuit is further configured to couple the plurality of global bit lines, one at a time, to the common output line.

8. The memory of claim 7, further comprising:
   a latching circuit having an input and an output, the input being coupled to the common output line;
   the latching circuit configured to (i) latch data on the selected global bit line of the plurality of global bit lines currently coupled by the selection circuit to the input by the common output line and to (ii) output the latched data at the output of the latching circuit.

9. The memory of claim 1, wherein each global bit line of the plurality of global bit lines is coupled to a plurality of multiple memory blocks.

10. The memory of claim 1, wherein the selection circuit is further configured to leave the plurality of global bit lines, that are not currently coupled to the common pre-charging circuit, floating.

11. A memory, comprising:
    a first memory block;
    a second memory block;
    a first global bit line electrically coupled to the first memory block;
    a second global bit line electrically coupled to the second memory block;
    a sensing circuit coupled between the first memory block and the first global bit line;

a global pre-charging device configured to pre-charge the first global bit line and the second global bit line to a pre-charge voltage lower than a power supply voltage that is applied to the global pre-charging device;

a common keeper circuit coupled to the global pre-charging device, and the common keeper circuit comprising:
   a pair of cross-coupled inverters;
   a first switch electrically coupled to the first global bit line; and
   a second switch electrically coupled to the second global bit line, wherein
   the first switch and the second switch are electrically coupled to a same node, and are configured to be separately actuatable.

12. The memory of claim 11, wherein the common keeper circuit is configured to maintain the pre-charge voltage.

13. The memory of claim 11, wherein the sensing circuit comprises:
   a sense amplifier coupled to the first memory block; and
   a pull-down circuit coupled between the first global bit line and the sense amplifier.

14. The memory of claim 13, wherein the pull-down circuit comprises an n-channel metal-oxide semiconductor (NMOS) transistor having:
   a gate terminal connected to an output terminal of the sense amplifier; and
   a drain terminal connected to the first global bit line.

15. The memory of claim 11, wherein the global pre-charging device comprises:
   an n-channel metal-oxide semiconductor (NMOS) transistor coupled to the first global bit line, the pre-charge voltage being a difference between the power supply voltage and a threshold voltage of the NMOS transistor; and
   a switch coupled between the NMOS transistor and a power supply having the power supply voltage, the switch being configured to apply the power supply voltage to the first global bit line by the NMOS transistor in response to a pre-charge signal applied to the switch.

16. The memory of claim 15, wherein
the switch comprises a p-channel metal-oxide semiconductor (PMOS) transistor having a source terminal coupled to the power supply, and a gate terminal configured to receive the pre-charge signal; and
the NMOS transistor comprises a drain terminal coupled to the first global bit line, a source terminal coupled to a drain terminal of the PMOS transistor, and a gate terminal configured to receive a selection signal for selecting the first global bit line.

17. A method of operating a memory, the method comprising:
   coupling a first global bit line to a global pre-charging circuit, while a second global bit line is decoupled from the global pre-charging circuit;
   pre-charging, by the global pre-charging circuit, the first global bit line coupled to at least one memory block including multiple memory cells of the memory, to a pre-charge voltage between a power supply voltage that is applied to the global pre-charging circuit and a ground voltage;
   maintaining the pre-charge voltage on the first global bit line by applying the pre-charge voltage to a pair of cross-coupled inverters coupled to the first global bit line; and
   during a reading operation, pulling down the first global bit line from the pre-charge voltage to the ground voltage, or pulling up the first global bit line from the pre-charge voltage to another power supply voltage based on data stored in a memory cell of the multiple memory cells.

18. The method of claim 17, wherein
the pre-charging comprises coupling a power supply to the first global bit line by an n-channel metal-oxide semiconductor (NMOS) transistor, the power supply having the power supply voltage that is applied to the global pre-charging circuit, and
the pre-charge voltage is a difference between the power supply voltage that is applied to the global pre-charging circuit and a threshold voltage of the NMOS transistor.

19. The method of claim 17, wherein
the memory comprises:
   a plurality of memory blocks, each memory block of the plurality of memory blocks including multiple memory cells of the memory, and
   a plurality of global bit lines, each global bit line of the plurality of global bit lines coupled to at least one of the plurality of memory blocks;
the method further comprises selectively pre-charging at least one global bit line of the plurality of global bit lines to the pre-charge voltage by the global pre-charging circuit.

20. The method of claim 19, wherein
the selectively pre-charging comprises selectively coupling the at least one global bit line of the plurality of global bit lines to the global pre-charging circuit by a corresponding n-channel metal-oxide semiconductor (NMOS) transistor, and
the pre-charge voltage is a difference between the power supply voltage that is applied to the global pre-charging circuit and a threshold voltage of the NMOS transistor.

* * * * *